United States Patent [19]

Wolters

[11] 4,007,480
[45] Feb. 8, 1977

[54] COLOR TELEVISION RECEIVER BEAT FREQUENCY CONTROL USING STABILIZED TELEVISION TRANSMITTER AURAL CARRIER

[75] Inventor: Dale Wolters, Grandville, Mich.

[73] Assignee: West Michigan Telecasters Inc., Grand Rapids, Mich.

[22] Filed: Sept. 17, 1975

[21] Appl. No.: 614,304

[52] U.S. Cl. .................................. 358/1; 325/146; 332/16 R; 358/36; 358/197
[51] Int. Cl.$^2$ ........................................ H04N 9/02
[58] Field of Search ........... 358/1, 36, 12; 325/146; 332/16 R; 178/5.8 R, 5.8 A; 331/51, 69, 116 R

[56] References Cited

UNITED STATES PATENTS

| | | | |
|---|---|---|---|
| 3,548,085 | 12/1970 | Shimada | 178/5.8 A |
| 3,619,806 | 11/1969 | Phillips | 331/69 |
| 3,836,873 | 9/1974 | Healey, et al. | 331/116 R |
| 3,854,094 | 12/1974 | Towler | 325/146 |

OTHER PUBLICATIONS

Principles of Color Television : "The Color Television Standards of the FCC", Copyright 1956, John Wiley & Sons, Inc., pp. 283–284, Hazeltine Laboratories Staff.

Primary Examiner—Robert L. Griffin
Assistant Examiner—Aristotelis M. Psitos
Attorney, Agent, or Firm—Price, Heneveld, Huizenga & Cooper

[57] ABSTRACT

Interference in a television receiver due to variations in the frequency of a "920 KHz beat" frequency obtained from the difference in frequency between the 4.5 MHz intercarrier frequency and the 3.58 MHz color subcarrier frequency and detected by the receiver's video detector is reduced by using a color television transmitter having an aural oscillator using a crystal of a smaller size, an "AT" cut and higher frequency followed by frequency division of the oscillator output. The resulting output signal has improved frequency stability and is used as a basis for aural modulation in the television transmitter.

6 Claims, 1 Drawing Figure

COLOR TELEVISION RECEIVER BEAT FREQUENCY CONTROL USING STABILIZED TELEVISION TRANSMITTER AURAL CARRIER

BACKGROUND OF THE INVENTION

1. Field of the Invention

This invention relates to oscillators; and more particularly, to oscillators for use in color television transmitting apparatus.

2. Description of the Prior Art

Existing color television transmitters typically utilize crystal oscillators in a temperature controlled environment as their basic frequency determining elements. For example, transmitters have utilized low frequency (i.e., 100–200 KHz) crystals as the exciter for the audio portion of the television signal. Although the crystal provided the proper frequency, the frequency stability (i.e., drift) was unsatisfactory and led to interference which is noticeable on a television receiver's picture tube. Even though these oscillators are capable of maintaining the output frequencies of the aural and visual transmitters well within the ±1,000 Hz required by the Federal Communications Commission Rules, the intercarrier 4.5 MHz separation between the picture carrier frequency and the sound carrier frequency changes throughout the broadcast day as the crystals drift around their nominal frequencies. This change in separation can still be within the Federal Communications Commission specification of ±1,000 Hz, but causes a very undesirable interference seen on the picture tube of a television receiver.

This interference is referred to as "920 beat" which refers to the frequency difference between the intercarrier 4.5 MHz frequency and the color subcarrier 3.5 MHz frequency, or approximately 0.920 MHz. The interference is a receiver phenomenon caused by color television transmitters and is recognized by the presence of closely spaced gray lines usually sloping from the upper right to the lower left on television receiver picture tubes. Its presence is the result of the mixing of the two demodulated carriers, the intercarrier and the color subcarrier, at the receiver detector diode which, being a nonlinear device, forms sum and difference frequencies due to the presence of these carriers. The 920 KHz difference is the one of interest, since it falls into the video amplifier pass band.

The 920 beat problem is known and has been discussed in the McGraw-Hill television series, Donald G. Fink, Consulting Editor, 1954, Section 24–12, pages 611–612. The beat between the intercarrier and the color subcarrier at the difference frequency of 920 KHz is objectionable because the relatively low beat frequency produces a coarse interference pattern in the reproduced picture. Experiments have shown that this beat interference is much less objectionable if its frequency is an odd multiple of one-half of the horizontal line frequency because of the resultant interlace. Since a frame of 525 lines consists of two interlaced fields each of 262½ lines, if the interference is opposing in successive fields, the resultant frame has a reduced interference in comparison to either of its component fields.

In order to provide the desired interlacing for frequencies resulting from the beat between the color subcarrier and the intercarrier, the required 4.5 MHz separation is defined as the 286th harmonic of the horizontal line frequency. This is an even harmonic, resulting in no frequency interlace for 4.5 MHz, but since this beat usually has low amplitude in the video circuits, the fine pattern is not objectionable in the reproduced picture. Making 4.5 MHz an even harmonic with the color subcarrier an odd harmonic automatically makes the beat frequency of 0.920 MHz between the color subcarrier and the intercarrier an odd multiple of one-half the line frequency and results in reduction of the 920 (0.920 MHz) beat interference by interlace.

Since 4.5 MHz is specifically the 286th harmonic of the line frequency, the horizontal line scanning frequency becomes:

$$H = \frac{4.5 \; MHz}{286} = 15{,}734.26 \; Hz$$

With 525 horizontal lines per frame and 262½ lines per field, the vertical field scanning frequency becomes:

$$V = \frac{15{,}734.26}{262.5} = 59.94 \; Hz$$

The color subcarrier frequency is chosen as the 455th harmonic of one-half the horizontal line scanning frequency, which becomes:

$$C = 455 \; \frac{(15{,}734.26)}{2} = 3.579545 \; MHz$$

It can be readily seen that precesion frequency control of the 4.5 MHz intercarrier separation is essential to a color television system, since all of the other requisite frequencies are derived from it. The intercarrier frequency stability must be held as closely as that of the color subcarrier, within ±10 Hz and a rate of change not to exceed 0.1 Hz per second. This is virtually impossible when two transmitter crystals, one for the picture carrier and one for the sound carrier, are employed as frequency control devices. The 4.5 MHz separation varies from minute to minute as the crystal heaters cycle off and on and the crystal temperatures change. Typically, the 920 beat has objectionable periods through the day. Such as, for example, periods when the beat frequency varies from being an odd multiple of one-half of the horizontal line frequency. Additionally, variation of the 920 beat frequency is typically more noticeable than a fixed variation of the 920 beat frequency from the desired frequency, much as a moving light is more noticeable than a steady light displaced from a desired location. One possible method to maintain both the aural and visual transmitter frequencies to such close tolerances uses a rubidium standard, but the cost is prohibitive for many broadcasters.

SUMMARY OF THE INVENTION

In accordance with the method and apparatus of this invention, a relatively high frequency (greater than 1 MHz) crystal oscillator followed by frequency division is used to achieve an increased frequency stability of the 4.5 MHz intercarrier thereby reducing the 920 beat on television receivers. The oscillator using the crystal can properly interface with circuitry in a conventional transmitter and has an advantageously reduced cost from other well-known oscillators producing frequencies having comparable stability.

This invention recognizes that of the frequencies determining the 920 beat, the sound (aural) carrier frequency in the prior art typically has the greatest frequency variation due to temperature variation of the generating crystal. The picture carrier, which acts with the sound carrier to produce the 4.5 MHz intercarrier, has a sinusoidal relationship between the frequency of the generating crystal and the temperature of the crystal. The point corresponding to the desired frequency and temperature combination is typically chosen to be midway between the peaks of the sine wave. Thus, there is relatively little change in frequency produced by the crystal due to a change in temperature of the crystal. Similarly, the color subcarrier frequency, which together with the 4.5 MHz intercarrier produces the 920 beat, has a sinusoidal relationship between the frequency of the crystal and the temperature of the crystal. However, in contrast the crystal generating the sound carrier in prior art systems has a frequency-temperature relationship in the shape of an inverse parabola. Accordingly, any change in temperature of the crystal produces a greater change in frequency than had there been a sinusoidal relationship between frequency and temperature.

The inverse parabola frequency-temperature characteristic of the crystal generating the sound (i.e., aural) carrier frequency is due to the "X" or "DT" crystal cut required to produce the typically used sound carrier frequencies of about 100–200 KHz. This invention recognizes that a higher crystal frequency can be used for the sound (i.e., aural) carrier, and that this higher crystal frequency can be generated by a crystal having an "AT" cut and a sinusoidal frequency-temperature relationship. The invention thus eliminates crystals generating aural carrier frequencies at the relatively low known prior art frequencies which exhibit relatively large changes in frequency with changes in temperature due to the mass and cut of the crystal.

In accordance with an embodiment of this invention, the crystal generator for generating the aural carrier frequency has a much higher frequency than that required at the aural modulator. The circuitry following the crystal oscillator divides the high crystal frequency to obtain the desired aural carrier frequency to be modulated, about 200 KHz. As a result, there is a very stable, high frequency crystal controlled oscillator which has its output frequency divided to provide a desired lower frequency which is then modulated and multiplied.

DETAILED DESCRIPTION OF THE PREFERRED EMBODIMENT

Figure 1:
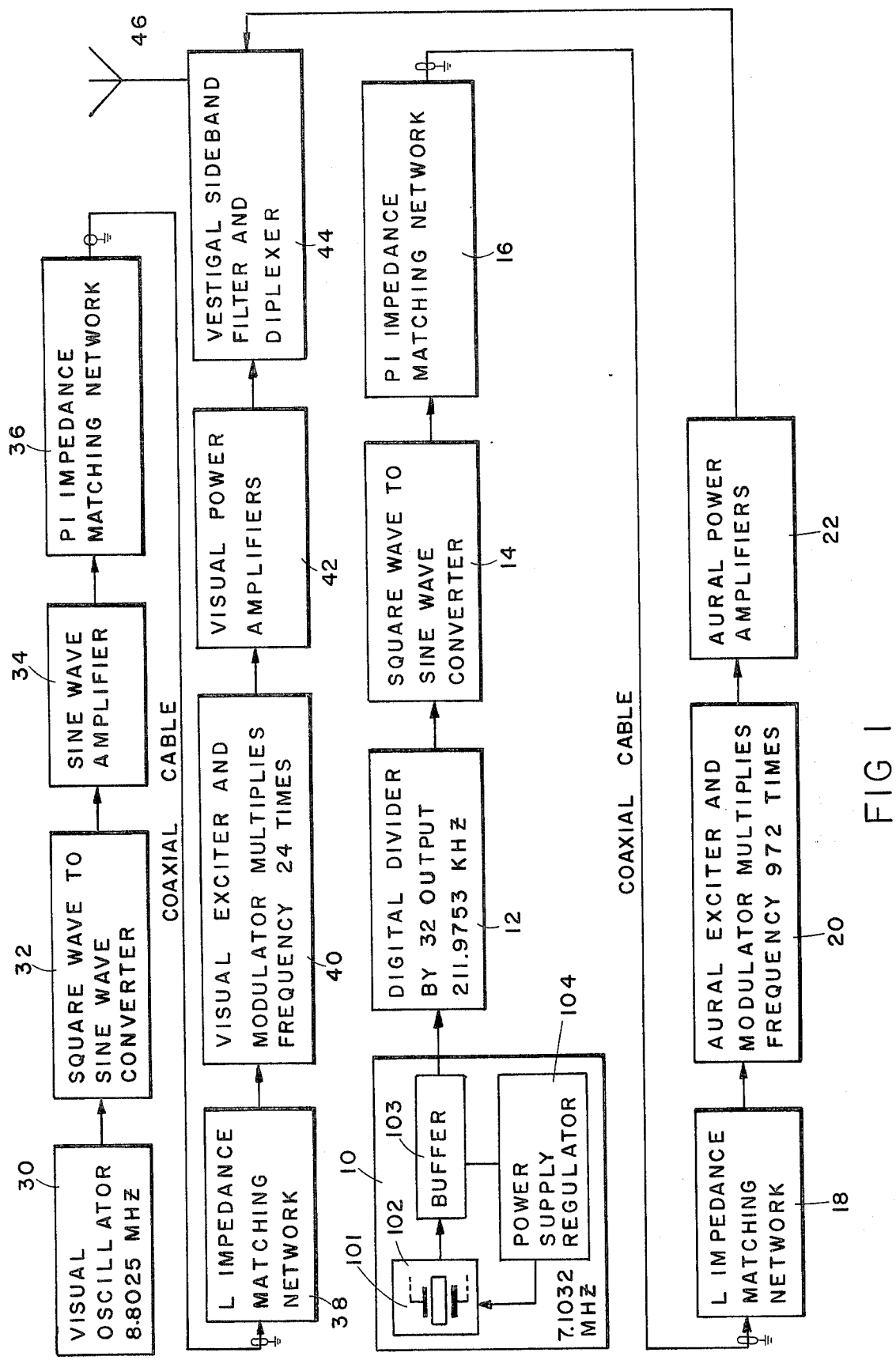
FIG. 1 is an electrical circuit diagram in block form of a television transmitter for generating aural and video signals in accordance with an embodiment of this invention.

Referring to FIG. 1, a block diagram of a color television transmitter includes a series of blocks for generating and modulating a visual (i.e., picture) carrier frequency and a series of blocks for generating and modulating an aural (i.e., sound) carrier frequency. An example of a suitable basic transmitter which can be modified to include the present invention is a General Electric Model TT50B. The aural carrier frequency section includes an oscillator 10, the output of which is coupled to a frequency divider 12. The output of divider 12 is coupled to a square wave to sine wave converter 14, in turn coupled to a PI impedance matching network 16 followed by an L impedance matching network 18. An aural exciter and modulator 20 receives signals from network 18 and applies the modulated aural carrier frequency to power amplifier 22.

The video carrier frequency generator includes oscillator 30 coupled to a square wave to sine wave converter 32, in turn coupled to a sine wave amplifier 34. The output of amplifier 34 is coupled to a PI impedance matching network 36 and an L impedance matching network 38. The output of network 38 is coupled to the frequency multiplier and video modulator circuit 40 in turn is coupled to visual power amplifier 42. A filter and diplexer circuit 44 receives the output of the aural and visual power amplifiers and couples the resultant television signal to an antenna 46 for transmission.

Specifically referring now to oscillator 10, the basic frequency determining device employed in the crystal oscillator is a precision "AT" cut crystal 101 such as Vectron type CO-204. Such crystals are ultrareliable, high stability frequency sources designed for applications where extreme long and short term accuracy are required. Oscillator 10 includes an automatic gain control circuit for maintaining the crystal current at a level which represents the best compromise between the low current desired for good long term stability and the high current desired for short term (phase) stability. Examples of circuits suitable for oscillator 10 are a Pierce oscillator or a Colpitts oscillator. The frequency of the aural crystal oscillator 10 in accordance with an embodiment of this invention is between about 1 and 10 MHz to obtain the advantages of a sufficiently high frequency without requiring an excessively small crystal size or an unnecessarily large division of the generated frequency. Indeed, frequency stability is particularly advantageous if the frequency of the generated signal is limited to a range between about 5 MHz to about 10 MHz. In the preferred embodiment used for broadcast channel 13, a crystal frequency of 7.1032096 MHz was employed.

The crystal oscillator stage and other critical components are housed in a proportionally controlled oven 102 which maintains a constant temperature at the crystal's optimum operating temperature (turnover point). This results in excellent frequency stability over broad ambient temperature changes. A proportionally controlled oven considers the amount of temperature variation from the desired oven temperature when determining how much heat to add. It does not simply turn on when there is a temperature variation from the desired temperature and turn off when the desired temperature is reached. Additionally, the oven can be fully sealed and capable of operation in 100% humidity.

Circuit 10 includes a series of buffer circuits 103 coupled for isolating the crystal oscillator stage itself from external load variations. Power is supplied to circuit 10 by a zener diode referenced regulator 104 which minimizes the effects of external power supply fluctuations and is filtered to significantly reduce input line ripple. Circuit 10 includes electronic tuning (VCXO) operation to permit frequency adjustment of the crystal output to compensate for crystal aging. For example, there can be a 10 turn 20 K ohm control resistor coupled to the crystal to provide a maximum frequency adjustment range of $3 \times 10^{-7}$ Hz. At an output carrier frequency of 210 MHz, for example, the maximum change available is around 61 Hz. Resolution of the absolute frequency setting is thereby relatively easy to obtain, since the crystal frequency will shift only about 6 Hz per turn of the control, which in turn can be driven by a gear reduction dial which has an indexing ratio of 1000:1.

Typical characteristics of an oscillator unit in accordance with an embodiment of this invention for use with broadcast television channel 13 are as follows. The stability or aging rate is $1 \times 10^{-9}$ Hz per day, the output level is 1 V into 50 ohms load, the output frequency of the crystal oscillator for the aural carrier is 7.1032096 MHz, the frequency offset versus changes in supply and load voltages and temperature are as follows:

| Supply | ±5% | | less than $\pm 2 \times 10^{-9}$ |
|---|---|---|---|
| Load | ±10% | | less than $\pm 1 \times 10^{-9}$ |
| 0° C | to | +50° C | less than $\pm 5 \times 10^{-9}$ |
| −20° C | to | +70° C | less than $\pm 1 \times 10^{-8}$ |

The short term stability is less than $1 \times 10^{-10}$ per second, the phase noise for single side band (SSB) in db per Hz at 100 Hz from carrier frequency is −110 db and at 1 KHz from carrier frequency is −120 db. The input voltage is 24 V DC, input power at turn on is 5 W and stabilized at 25° C is 2½ W.

Frequency divider 12 divides the output frequency of oscillator 10 thereby reducing the frequency to about the frequency typically generated by prior art crystal oscillators for the aural carrier frequency. In accordance with an embodiment of this invention for use with channel 13, an input frequency of 7.1032096 MHz is divided by 32 to produce an output of 211.9753 KHz. Frequency divider 12 can include a commercially available JK flip-flop circuit to divide by two and then a 4-bit counter to divide by 16 thereby producing a total division by 32. It can be appreciated that such division is advantageous because any slight frequency error remaining in the frequency at the intput to frequency divider 12 is reduced by 32 at the output of frequency divider 12. Such a reduction in frequency error is not achieved if the crystal generates a lower frequency and frequency division is not necessary. Crystal 11 generates a signal having a frequency at least five times greater and, advantageously, at least twenty-five times greater than the desired frequency for aural modulation.

Converter 14 receives the output of circuit 12 and produces an output which is a sine wave of the same frequency of the output of frequency divider 12. Typically, the input to converter 14 is a square wave because the high accuracy crystal used in oscillator 10 typically produces square waves which, in turn, are applied to the digital circuits of divider 12. The square wave to sine wave conversion produced by converter 14 was typically not necessary in the prior art because the crystals producing lower frequency for the aural carrier in the prior art produced a sine wave.

Circuits 16 and 18 are known in the prior art to match impedances. Similarly, circuit 20 is known in the prior art and modulates the aural carrier in accordance with an aural information signal and multiplies the input frequency to circuit 20 by 972 times. After the multiplication by 972, the frequency output of circuit 20 for channel 13 is 215.76 MHz. This frequency is then the input for circuit 22 which amplifies the aural carrier.

Independent measurements of the stability of the output of the aural carrier frequency have indicated essentially a 0 Hz deviation. That is, stability is obtainable down to the nearest single cycle and, typically, is stable down to the nearest tenth of a cycle. This is typically a stability three orders of magnitude better than that achieved by the video carrier and by an aural carrier using a crystal to generate a frequency in the 100–200 KHz range.

The generation and modulation of the video carrier frequency is conventional. Circuit 30 generates a video carrier frequency of, for example, for broadcast channel 13, 8.8025 MHz. Typically, a square wave is generated which is then converted by circuit 32 to a sine wave and amplified by circuit 34. Impedance matching networks (36, 38) couple the signal to a visual exciter and a modulator 40. The modulated signal is amplified by circuit 42, filtered and transmitted from an antenna 46 through circuit 44.

It should be noted that the 972 multiplication factor used on the aural carrier (circuit 20) can vary with the type of transmitter. The factor 972 is typical in a Serrasoid type aural transmitter. For a given transmitted frequency and for a given crystal generated carrier frequency, between 1–10 MHz, it can be appreciated that the amount of division required of frequency divider 12 depends on the multiplication factor in circuit 20. Additionally, of course, the transmitted frequency varies with the television channel the transmitter is broadcasting. That is, channels 2–6 are between 54 to 88 MHz and channels 7–13 are between 174 to 216 MHz.

Various modifications and variations will no doubt occur to those skilled in the art to which this invention pertains. For example, the amount of the division of the crystal frequency can be varied depending upon the final output frequency which is desired. Similarly, the frequency of the crystal generating the aural carrier frequency can also be varied depending upon the desired output frequency. These and all other variations which basically rely on the teachings through which this disclosure has advanced the art are properly considered within the spirit and broader aspects of this invention as defined by the appended claims.

The embodiments of the invention in which an exclusive property or privilege is claimed are defined as follows:

1. In combination with a color television transmitter, an aural carrier frequency generating device, for generating the aural carrier of said color television transmitter, comprising:
    a proportionally controlled oven;
    an "AT" cut crystal oscillator housed in said oven having a frequency of from about 1MHz to 10MHz, including means for generating a square wave signal and converting the square wave signal to a sine wave signal of the same frequency;
    a frequency dividing network whereby the output of the oscillator is divided by an amount equal to the factor by which the frequency produced by the crystal oscillator is greater than the frequency desired for aural modulation, thereby reducing frequency variations in the aural carrier to substantially eliminate frequency variations in the best frequency in a color television receiver between the aural carrier and a signal of another frequency; and a frequency multiplying means coupled to said frequency dividing network for multiplying the output of said frequency dividing network so the frequency output of said multiplying means falls within the 54 to 88 MHz or 174 to 216 MHz television broadcast frequencies.

2. A color television transmitter as recited in claim 1 wherein said crystal oscillator includes electronic tuning to permit frequency adjustment of the crystal output frequency to compensate for crystal aging.

3. A color television transmitter as recited in claim 1 wherein said crystal oscillator includes an automatic gain control circuit for maintaining the magnitude of the crystal current sufficiently low for good long term stability and sufficiently high for good phase stability.

4. A color television transmitter as recited in claim 1 wherein the frequency of said crystal oscillator is approximately 7.1032096 MHz for use in broadcasting television channel 13.

5. A color television transmitter as recited in claim 4 wherein said frequency dividing network divides the input from said crystal oscillator by 32 to produce an output frequency of approximately 211.9753 KHz.

6. A color television transmitter as recited in claim 5 wherein said frequency multiplying means multiplies the output of said frequency dividing network by 972 so the frequency output of said multiplying means is approximately 215.76 MHz.

* * * * *

UNITED STATES PATENT AND TRADEMARK OFFICE
CERTIFICATE OF CORRECTION

PATENT NO. : 4,007,480
DATED : February 8, 1977
INVENTOR(S) : Dale Wolters

It is certified that error appears in the above-identified patent and that said Letters Patent are hereby corrected as shown below:

Column 2, line 33:

"preceision" should be --- precision ---;

Column 5, line 9:

"chennel" should be --- channel ---;

Column 5, line 42:

"intput" should be --- input ---;

Column 6, line 67:

"best" should be --- beat ---;

Signed and Sealed this

Seventeenth Day of May 1977

[SEAL]

Attest:

RUTH C. MASON
Attesting Officer

C. MARSHALL DANN
Commissioner of Patents and Trademarks